(12) United States Patent
Shimizu et al.

(10) Patent No.: US 8,952,454 B2
(45) Date of Patent: Feb. 10, 2015

(54) SOI WAFER AND METHOD OF MANUFACTURING THE SAME

(71) Applicants: Kazuhiro Shimizu, Tokyo (JP); Junichi Yamashita, Tokyo (JP); Takuichiro Shitomi, Tokyo (JP)

(72) Inventors: Kazuhiro Shimizu, Tokyo (JP); Junichi Yamashita, Tokyo (JP); Takuichiro Shitomi, Tokyo (JP)

(73) Assignee: Mitsubishi Electric Corporation (JP)

( * ) Notice: Subject to any disclaimer, the term of this patent is extended or adjusted under 35 U.S.C. 154(b) by 89 days.

(21) Appl. No.: 13/673,263

(22) Filed: Nov. 9, 2012

(65) Prior Publication Data

US 2013/0221439 A1    Aug. 29, 2013

(30) Foreign Application Priority Data

Feb. 23, 2012 (JP) ................. 2012-037024

(51) Int. Cl.
| | | |
|---|---|---|
| *H01L 27/12* | (2006.01) | |
| *H01L 23/544* | (2006.01) | |
| *H01L 21/762* | (2006.01) | |

(52) U.S. Cl.
USPC ............. 257/347; 257/797; 257/E27.112; 257/E23.179; 257/E21.545; 257/E21.561; 257/E21.564; 438/401; 438/412; 438/422

(58) Field of Classification Search
USPC ............. 257/347, 797, E27.112, E23.179, 257/E21.545, E21.561, E21.564; 438/401, 438/404, 406, 411, 412, 421, 422
See application file for complete search history.

(56) References Cited

U.S. PATENT DOCUMENTS

| | | | | |
|---|---|---|---|---|
| 5,493,137 | A * | 2/1996 | Satoh et al. ............. | 257/296 |
| 6,376,291 | B1 | 4/2002 | Barlocchi et al. | |
| 7,253,082 | B2 * | 8/2007 | Adachi et al. ............. | 438/459 |
| 7,285,825 | B2 * | 10/2007 | Nagano et al. ............. | 257/347 |
| 2003/0080430 | A1 | 5/2003 | Leuschner et al. | |
| 2004/0012041 | A1 * | 1/2004 | West et al. ............. | 257/228 |
| 2004/0217438 | A1 * | 11/2004 | Chien ............. | 257/499 |
| 2012/0139080 | A1 * | 6/2012 | Wang et al. ............. | 257/506 |
| 2013/0214382 | A1 * | 8/2013 | Wang et al. ............. | 257/506 |

FOREIGN PATENT DOCUMENTS

| | | |
|---|---|---|
| DE | 10142223 C2 | 10/2003 |
| DE | 69935495 T2 | 11/2007 |
| JP | 2004-146461 A | 5/2004 |
| JP | 2004-228206 A | 8/2004 |

OTHER PUBLICATIONS

H. Luoto; "MEMS on cavity-SOI wafers"; Solid-State Electronics 51, (2007); pp. 328-332; www.sciencedirect.com.
An Office Action issued by the German Patent Office on Jul. 7, 2014, which corresponds to German Patent Application No. 10 2013 202 484.3 and is related to U.S. Appl. No. 13/673,263; with partial English language translation.

* cited by examiner

*Primary Examiner* — Victor A Mandala
(74) *Attorney, Agent, or Firm* — Studebaker & Brackett PC; Donald R. Studebaker

(57) ABSTRACT

An SOI wafer according to the present invention includes a support substrate and an insulating layer formed on the support substrate, a predetermined cavity pattern being formed on one of main surfaces of the support substrate on which the insulating layer is provided, further includes an active semiconductor layer formed on the insulating layer with the cavity pattern being closed, the active semiconductor layer not being formed in an outer peripheral portion of the support substrate, and further includes a plurality of superposition mark patterns formed in the outer peripheral portion on the one of the main surfaces of the support substrate for specifying a position of the cavity pattern.

8 Claims, 7 Drawing Sheets

F I G. 1
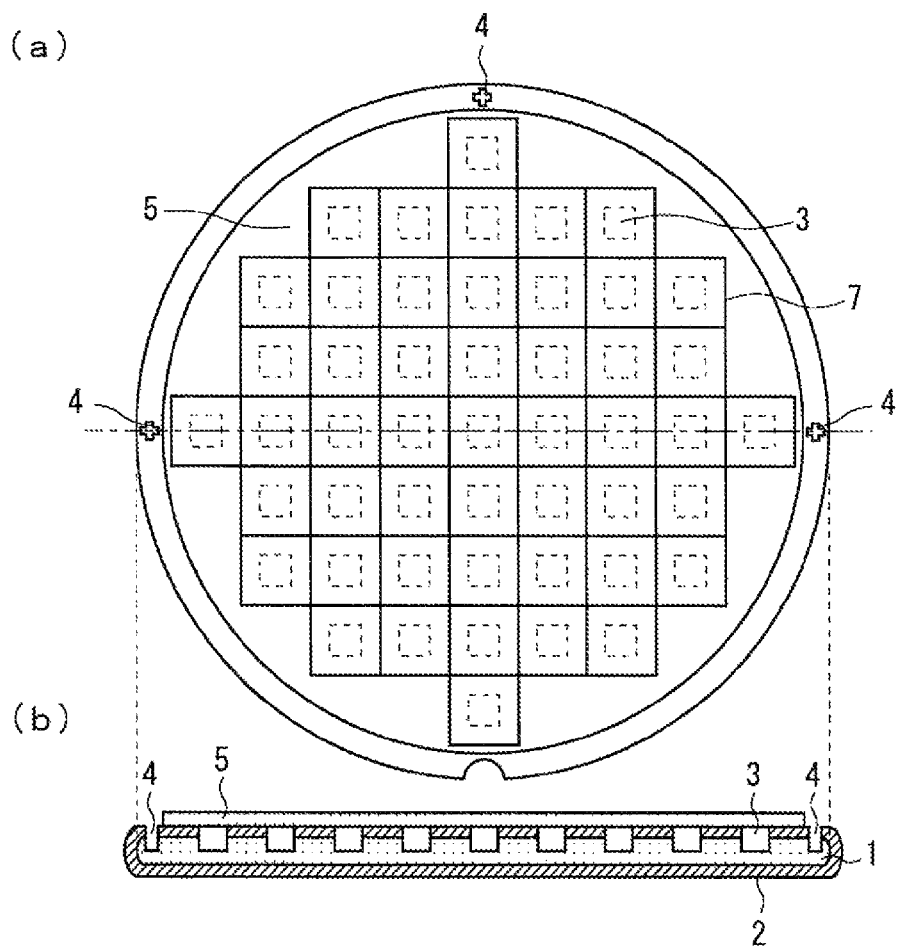

F I G. 2
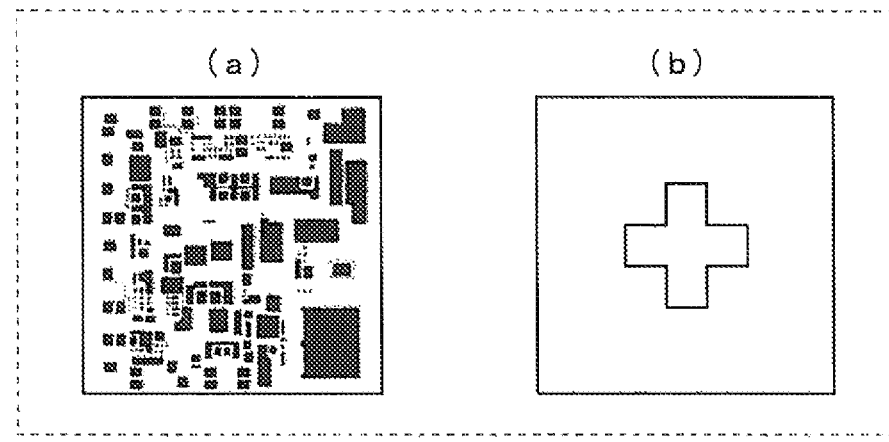

F I G. 5
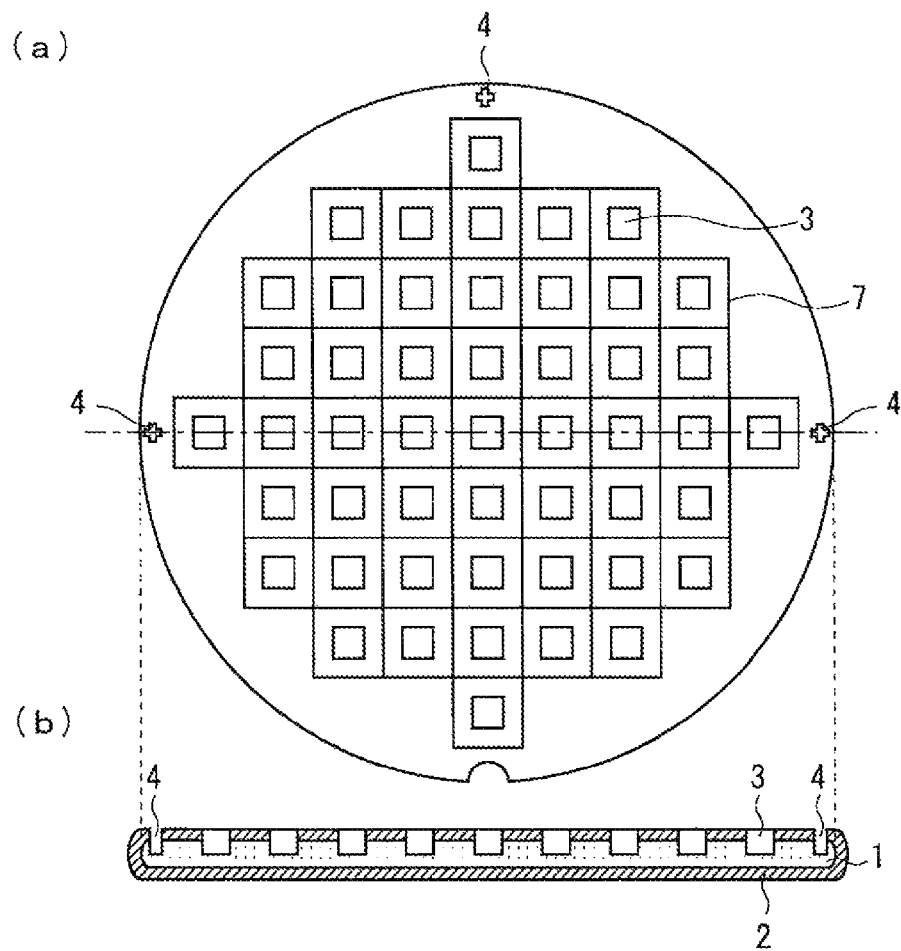

SOI WAFER AND METHOD OF MANUFACTURING THE SAME

BACKGROUND OF THE INVENTION

1. Field of the Invention

The present invention relates to an SOI wafer and a method of manufacturing the same.

2. Description of the Background Art

As a method of manufacturing an SOI (Semiconductor on Insulator) wafer including a cavity pattern therein, there is known a bonding technique in which two silicon substrates are bonded to each other (for example, see Japanese Patent Application Laid-Open No. 2004-146461). Japanese Patent Application Laid-Open No. 2004-146461 describes a method of bonding a support substrate having a cavity pattern and an insulating layer formed thereon to an active semiconductor layer substrate for forming a device with the cavity pattern and the insulating layer being interposed therebetween. Moreover, there is known an SOI wafer in which a portion having an insulating layer and a portion having no insulating layer are provided as a predetermined pattern in the SOI wafer (see Japanese Patent Application Laid-Open No. 2004-228206).

When carrying out an exposure over an SOI wafer having a pattern formed therein as described above, it is necessary to perform the exposure by aligning the position of the pattern in the wafer and the position of an exposure mask with each other. However, an active semiconductor layer on a front surface of the wafer usually has a thickness of approximately 10 μm. Therefore, the pattern in the wafer is intercepted by the active semiconductor layer. Accordingly, the position of the pattern in the wafer cannot be detected by an image recognition with use of a detector provided in an exposing device. For this reason, an ordinary exposing device, more specifically, an exposing device for detecting a pattern on a front surface of a wafer to carry out an alignment of an exposure mask, cannot be compatible with an SOI wafer having a pattern in the wafer.

For this reason, in the background art, a superposition mark pattern for specifying the position of the pattern in the wafer is formed on a back surface of the SOI wafer having a pattern therein, and the pattern is detected by a special exposing device having a back surface detection, in order to align the exposure mask and the SOI wafer with each other by a method of indirectly recognizing the position of the pattern in the wafer.

Description will be given to the special exposing device having the back surface detection. A wafer stage holding the wafer has a hole penetrating therethrough. A superposition mark pattern is formed in such a manner that the superposition mark pattern on the back surface of the wafer is positioned in the hole, and the wafer is disposed in an optimum position on the wafer stage. By a detector disposed on the back side of the wafer stage, the position of the superposition mark pattern is detected via the hole penetrating through the wafer stage by means of a camera of the detector, for example. By a control unit provided in the exposing device, the position of the superposition mark pattern thus detected is analyzed to specify the position of the pattern in the wafer. Information on the position is sent to a mask stage holding the exposure mask, and the mask stage is moved to an optimum position on the wafer to carry out the exposure.

As described above, in the background art, in the case in which the exposure is carried out over the front surface of the SOI wafer having the pattern in the wafer, the superposition mark pattern for specifying the position of the pattern in the wafer is formed on the back surface of the SOI wafer, and furthermore, the special exposing device having the back surface detection is used to expose the SOI wafer in order to detect the pattern on the back surface.

In the SOI wafer including the pattern therein according to the background art, the pattern for specifying the position of the pattern in the wafer is to be formed on the back surface of the wafer. Consequently, a manufacturing process is complicated. For this reason, there is a problem in that a manufacturing cost is increased. In the case in which the SOI wafer is exposed, there is another problem in that it is necessary to use the special exposing device having the back surface detection and an equipment cost is also increased.

SUMMARY OF THE INVENTION

The present invention is directed to an SOI wafer including a cavity pattern in the wafer and a method of manufacturing the same. It is an object of the present invention to provide an SOI wafer capable of aligning an exposure mask at a low cost when carrying out an exposure over the SOI wafer, and a method of manufacturing the same.

An SOI wafer according to the present invention includes a support substrate and an insulating layer formed on the support substrate. A predetermined cavity pattern is formed on one of main surfaces of the support substrate on which the insulating layer is provided. The SOI wafer according to the present invention further includes an active semiconductor layer formed on the insulating layer with the cavity pattern being closed. The active semiconductor layer is not formed in an outer peripheral portion of the support substrate. The SOI wafer according to the present invention further includes a plurality of superposition mark patterns formed in the outer peripheral portion on the one of the main surfaces of the support substrate for specifying a position of the cavity pattern.

According to the present invention, the position of the predetermined cavity pattern formed in the wafer is specified by the superposition mark patterns. The superposition mark patterns can be detected by an ordinary exposing device. Therefore, it is possible to recognize the position of the cavity pattern by means of the superposition mark patterns. Accordingly, it is possible to obtain an effect of reducing an equipment cost. Furthermore, in the method of manufacturing an SOI wafer according to the present invention, the superposition mark patterns are not formed on the back surface of the wafer as in the background art but is formed on a front surface of the wafer, more specifically, the one of the main surfaces of the support substrate. Therefore, a manufacturing process can be simplified and a manufacturing cost can be reduced.

These and other objects, features, aspects and advantages of the present invention will become more apparent from the following detailed description of the present invention when taken in conjunction with the accompanying drawings.

BRIEF DESCRIPTION OF THE DRAWINGS

Parts (a) and (b) of FIG. 1 are a plan view and a sectional view showing an SOI wafer according to a first preferred embodiment, respectively;

Parts (a) and (b) of FIG. 2 are plan views showing a cavity pattern and a superposition mark pattern on the SOI wafer according to the first preferred embodiment;

Figure 3:
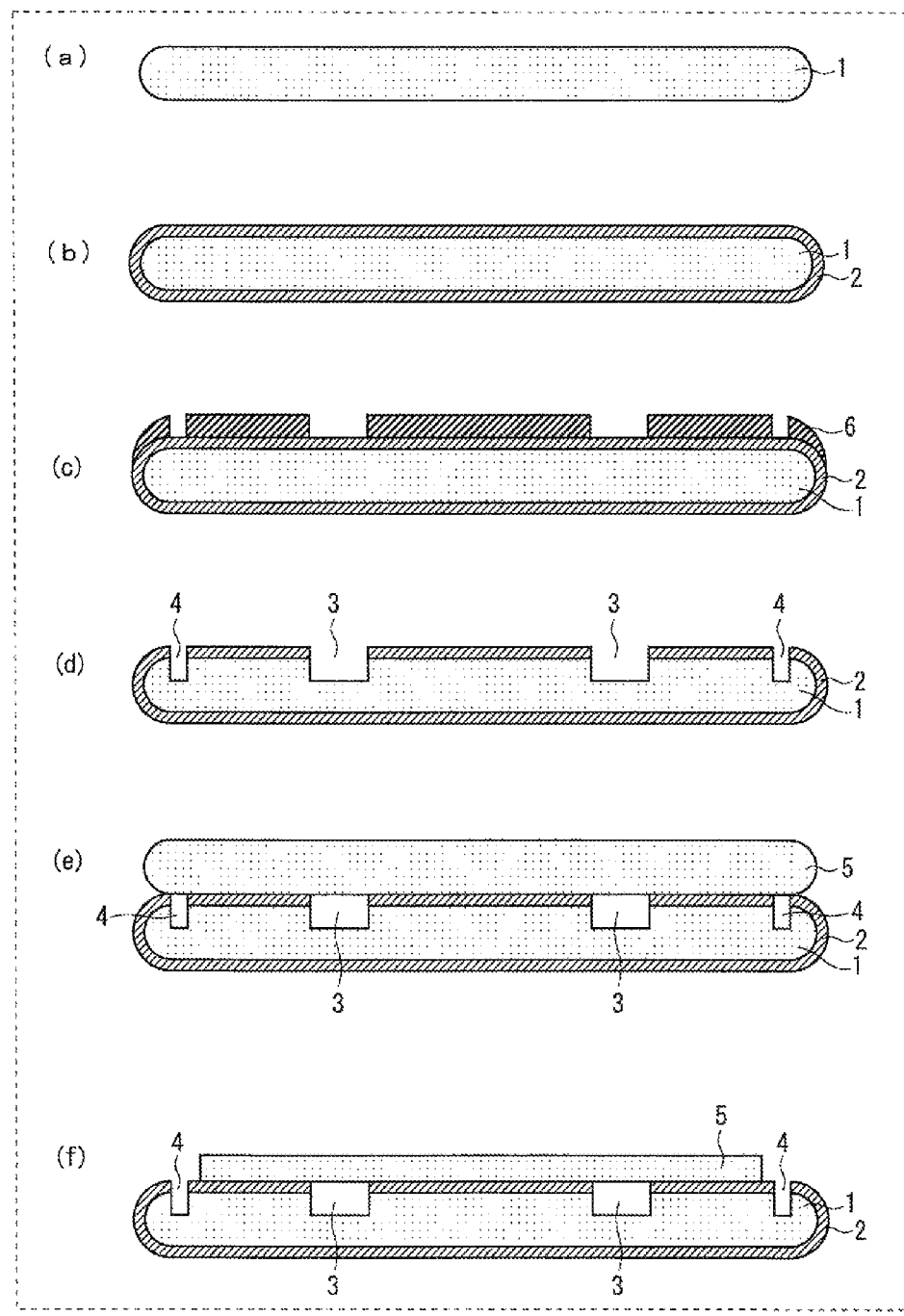
Figure 4:
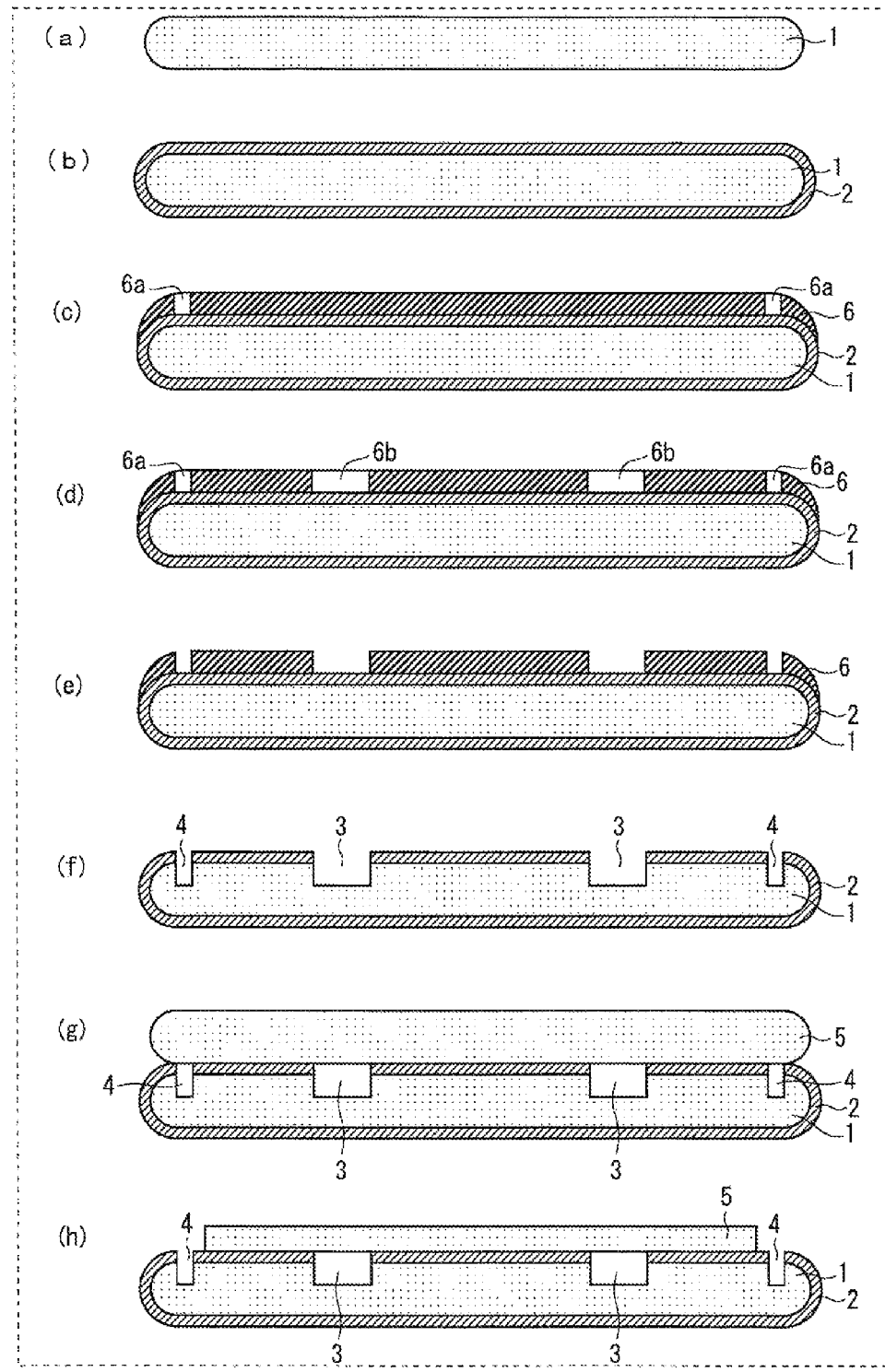
Figure 6:
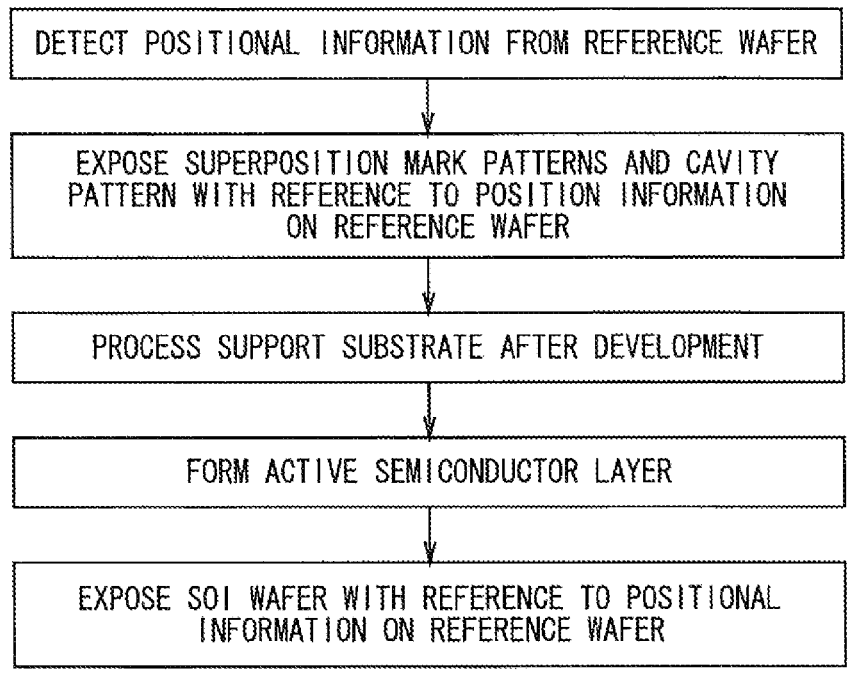
Figure 7:
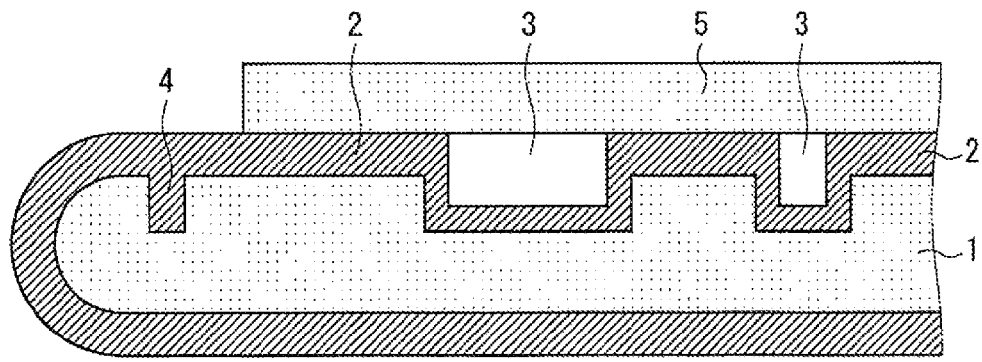
Figure 8:
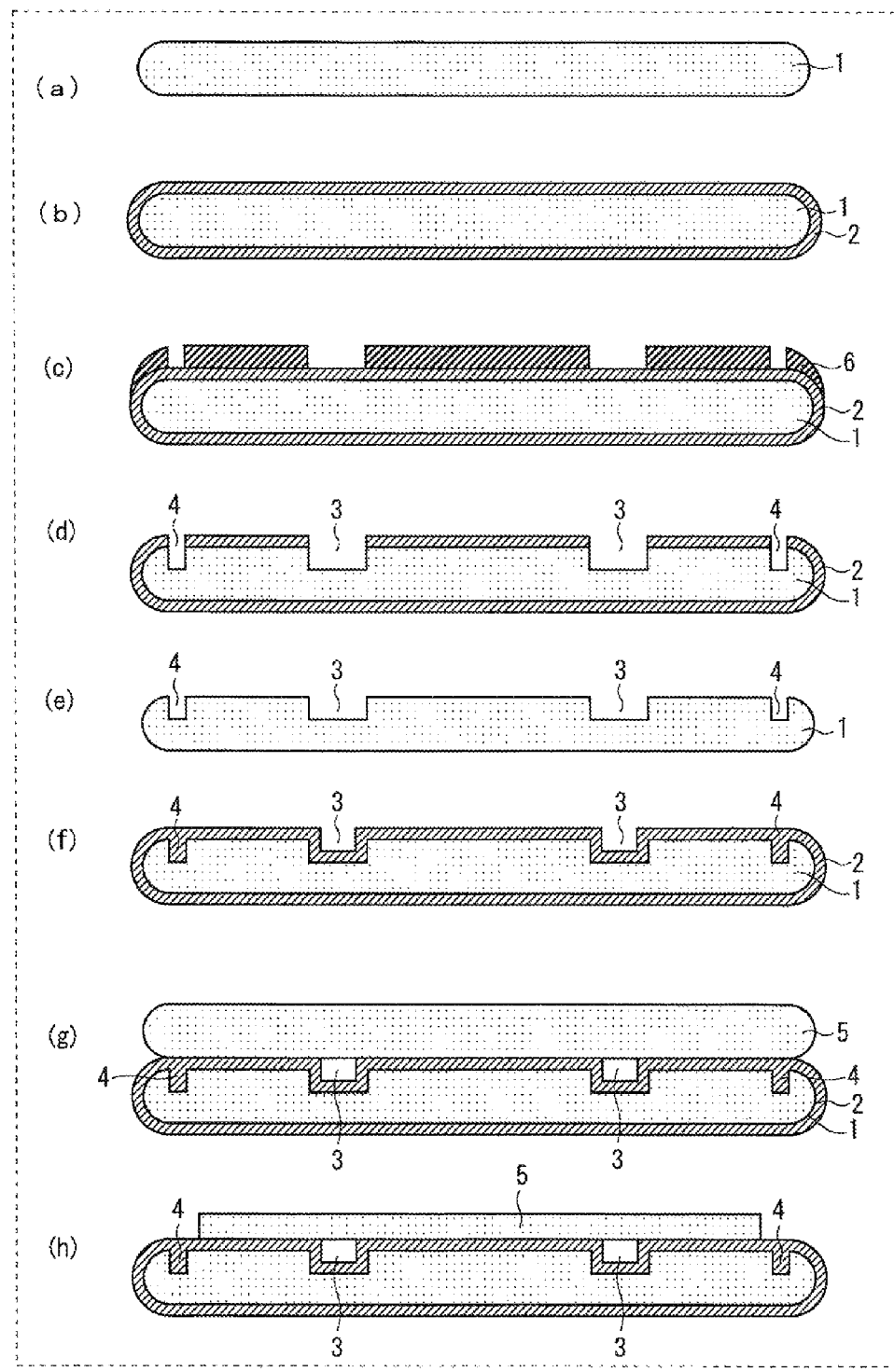

Parts (a) to (f) of FIG. 3 are views showing a process of manufacturing the SOI wafer according to the first preferred embodiment;

Parts (a) to (h) of FIG. 4 are views showing a process of manufacturing an SOI wafer according to a second preferred embodiment;

FIG. 5 includes a plan view and a sectional view showing a reference wafer according to a third preferred embodiment;

FIG. 6 is a flow chart showing a method of manufacturing an SOI wafer according to the third preferred embodiment;

FIG. 7 is a view showing a structure of an SOI wafer according to a fourth embodiment; and Parts (a) to (h) of FIG. 8 are views showing a process of manufacturing the SOI wafer according to the fourth preferred embodiment.

DESCRIPTION OF THE PREFERRED EMBODIMENTS

First Preferred Embodiment

Structure of SOI Wafer

Part (a) of FIG. 1 is a plan view and part (b) of FIG. 1 is a sectional view each showing a structure of an SOI wafer according to the present preferred embodiment. The SOI wafer according to the present preferred embodiment is formed by bonding a support substrate 1 having a silicon oxide film serving as an insulating layer 2 on a front surface and a substrate for an active semiconductor layer 5 with the silicon oxide film being interposed therebetween. Herein, a cavity pattern 3 and a plurality of superposition mark patterns 4 are formed on the insulating layer 2 and the support substrate 1 by a method which will be described later. Moreover, an outer peripheral portion of the support substrate 1 has a region in which the active semiconductor layer 5 is not formed. A front surface of the active semiconductor layer 5 corresponds to the front surface of the SOI wafer on which a semiconductor element is to be formed. Furthermore, the support substrate 1 and the substrate for the active semiconductor layer 5 are silicon substrates.

The predetermined cavity pattern 3 is formed on one of the main surfaces of the support substrate 1 on which the insulating layer 2 is provided, in other words, on the active semiconductor layer 5 side. The cavity pattern 3 is formed as a deep trench having a desirable depth from the front surface of the support substrate 1 in penetration through the insulating layer 2, and the cavity pattern 3 is closed with the active semiconductor layer 5 so that an inner portion of the cavity pattern 3 serves as a cavity. The cavity pattern 3 is formed in a device forming region 7 as shown in part (a) of FIG. 1. The cavity pattern 3 is a predetermined pattern which is designed depending on a semiconductor pattern to be formed on the SOI wafer. Part (a) of FIG. 2 shows an example of a plan view of the cavity pattern 3.

Moreover, the superposition mark patterns 4 for specifying the position of the cavity pattern 3 are formed in the outer peripheral portion of the one of the main surfaces. In the same manner as the cavity pattern 3, each of the superposition mark patterns 4 is formed as a deep trench having a desirable depth from the front surface of the support substrate 1 in penetration through the insulating layer 2. Furthermore, the superposition mark patterns 4 are not closed with the active semiconductor layer 5 but are exposed to the front surface of the SOI wafer. The superposition mark patterns are formed in a region inside by approximately 5 mm from an outermost periphery of the support substrate 1. Part (b) of FIG. 2 shows an example of the superposition mark pattern 4.

In addition, a positional relationship between each of the superposition mark patterns 4 and the cavity pattern 3 is specified, and information on the relative position of the cavity pattern 3 with respect to the plurality of superposition mark patterns 4 is stored in an exposing device.

<Method of Manufacturing SOI Wafer>

Description will be given to a method of manufacturing the SOI wafer having the structure described above. Parts (a) to (f) of FIG. 3 show a process of manufacturing the SOI wafer according to the present preferred embodiment. First of all, a silicon substrate is prepared as the support substrate 1 (part (a) of FIG. 3). A silicon oxide film serving as the insulating layer 2 is formed on the support substrate 1 by using a thermal oxidation method or a CVD method (part (b) of FIG. 3). Next, an exposing step is executed by using an equimultiple projection exposing device in the present preferred embodiment. A resist is applied to one of the main surfaces of the support substrate 1 on which the insulating layer 2 is formed, and an exposure mask having both the cavity pattern 3 and the superposition mark patterns 4 is used to carry out an exposure at the same time. The exposed resist is developed so that opening portions corresponding to the cavity pattern 3 and the superposition mark patterns 4 are formed on the resist 6 (see part (c) of FIG. 3).

Etching of the insulating layer 2 and etching of the support substrate 1 are carried out to the opening portions so that deep trenches each having a depth reaching the support substrate 1 in penetration through the silicon oxide film, that is, the insulating layer 2, are formed and the cavity pattern 3 and the superposition mark patterns 4 are formed at the same time (part (d) of FIG. 3). Herein, the etching is carried out as anisotropic dry etching or wet etching. By adjusting a period for the etching, it is possible to regulate the depth of the deep trenches.

The positional relationship between the plurality of superposition mark patterns 4 and the cavity pattern 3 is specified by the same exposure mask, and the positional relationship, more specifically, the information on the relative position of the cavity pattern 3 with respect to the plurality of superposition mark patterns 4 is stored in the exposing device.

Next, the support substrate 1 on which the insulating layer 2 is formed and the substrate for the active semiconductor layer 5 are bonded to each other with the insulating layer 2 being interposed therebetween (part (e) of FIG. 3). A well-known method is used as the bonding method. For example, the substrate for the active semiconductor layer 5 having a bonded surface being mirror-finished is bonded onto the insulating layer 2 by carrying out a heat treatment for three hours in an atmosphere of 1100° C. in a contact state in the air at a room temperature. By this step, the cavity pattern 3 is closed with the active semiconductor layer 5 so that the inner portion of the cavity pattern 3 serves as a cavity. In this step, moreover, the superposition mark patterns 4 are also closed.

Next, the active semiconductor layer 5 is polished into a predetermined thickness, for example, a thickness of 10 μm and an end surface processing for removing the outer peripheral portion of the active semiconductor layer 5 is further carried out to expose the superposition mark patterns 4 formed in the outer peripheral portion of the support substrate 1 (part (f) of FIG. 3). By the above steps, it is possible to manufacture the SOI wafer according to the present preferred embodiment.

<Effects>

The SOI wafer according to the present preferred embodiment includes the support substrate 1 and the insulating layer 2 formed on the support substrate 1, the predetermined cavity pattern 3 is formed on the one of the main surfaces of the support substrate 1 on which the insulating layer 2 is provided, the SOI wafer further includes the active semiconductor layer 5 formed on the insulating layer 2 so as to close the cavity pattern 3, the active semiconductor layer 5 is not formed in the outer peripheral portion of the support substrate 1 but is formed in the outer peripheral portion on the one of the main surfaces of the support substrate 1, and the SOI wafer further includes the superposition mark patterns 4 for specifying the position of the cavity pattern 3.

When the semiconductor pattern is to be exposed onto the SOI wafer, accordingly, the plurality of superposition mark patterns 4 exposed to the front surface of the wafer for specifying the position of the cavity pattern 3 are detected by using the ordinary exposing device, so that the exposure mask and the SOI wafer can be aligned with each other. Therefore, it is possible to expect a reduction in an equipment cost with no need to use a special exposing device having a back surface detection as in the background art.

Moreover, the cavity pattern 3 and the superposition mark patterns 4 which are provided to the SOI wafer according to the present preferred embodiment are characterized by being formed to have the depths reaching the support substrate 1 in penetration through the insulating layer 2. Accordingly, the property of the SOI wafer can be changed depending on the arrangement and the depth of the cavity pattern 3. Therefore, it is possible to enhance a degree of freedom of a semiconductor device to be formed on the SOI wafer.

Moreover, the method of manufacturing the SOI wafer according to the present preferred embodiment includes the step of preparing the support substrate 1, the step of forming the insulating layer 2 on the support substrate 1, the step of forming the predetermined cavity pattern 3 on the one of the main surfaces of the support substrate 1 on which the insulating layer 2 is provided, and the step of forming the active semiconductor layer 5 on the insulating layer 2 so as to close the cavity pattern 3. The active semiconductor layer 5 is not formed in the outer peripheral portion of the support substrate 1, and the method further includes the step of forming the plurality of superposition mark patterns 4 for specifying the position of the cavity pattern 3, in the outer peripheral portion on the one of the main surfaces of the support substrate 1.

In this manner, it is possible to manufacture the SOI wafer according to the present preferred embodiment. Moreover, the superposition mark patterns 4 are not formed on a surface opposite to the one of the main surfaces (the other main surface) of the support substrate 1, in other words, the back surface of the SOI wafer, as in the background art, but are formed on the front surface of the SOI wafer. Therefore, the manufacturing process can be more simplified as compared with the background art, so that it is possible to expect the effect of reducing the manufacturing cost.

Moreover, the method of manufacturing the SOI wafer according to the present preferred embodiment is characterized in that the step of forming the predetermined cavity pattern 3 on the one of the main surfaces of the support substrate 1 on which the insulating layer 2 is provided and the step of forming the plurality of superposition mark patterns 4 for specifying the position of the cavity pattern 3 in the outer peripheral portion on the one of the main surfaces of the support substrate 1 are carried out at the same time by using the same exposure mask. Therefore, the exposing step can be carried out at one time. Consequently, a throughput can be enhanced and the effect of reducing the manufacturing cost can be expected.

Second Preferred Embodiment

Method of Manufacturing SOI Wafer

Since a structure of an SOI wafer according to the present preferred embodiment is the same as that according to the first preferred embodiment, description thereof will be provided repeatedly. Moreover, an exposing step in a method of manufacturing the SOI wafer according to the present preferred embodiment is carried out by using a reduced projection exposing device.

The reduced projection exposing device will be described briefly. An exposure mask is disposed on a mask stage (which is also referred to as a reticle stage), and a pattern image passing through the exposure mask is reduced into ⅕ or the like by means of a projection lens, and is projected onto a wafer put on a wafer stage. The wafer stage is moved to carry out an exposure in a predetermined position of the wafer.

A method of manufacturing the SOI wafer according to the present preferred embodiment will be described with reference to parts (a) to (h) of FIG. 4. The step of preparing a support substrate 1 (part (a) of FIG. 4), the step of forming an insulating layer 2 (part (b) of FIG. 4), and the step of applying a resist are the same as those in the first preferred embodiment.

As the next step, an exposure mask for superposition mark patterns 4, that is, a second exposure mask is disposed on the mask stage, an exposure is carried out in positions (three places) of the superposition mark patterns 4 shown in part (a) of FIG. 1, for example, and a resist 6 is thus exposed to light (part (c) of FIG. 4). Then, an exposure mask for a cavity pattern, that is, a first exposure mask is disposed on the mask stage and the exposure is sequentially carried out for each section in a device forming region 7 shown in part (a) of FIG. 1, for example (part (d) of FIG. 4). Thereafter, the resist 6 is developed to remove resists 6a and 6b exposed to the light (part (e) of FIG. 4).

In the same manner as in the first preferred embodiment, subsequently, etching is carried out to form the superposition mark patterns and the cavity pattern (part (f) of FIG. 4). In this case, in order to specify a positional relationship between the superposition mark patterns and the cavity pattern which are thus formed, an arrangement of each pattern is checked and information for specifying the positional relationship is thus stored in the exposing device in the same manner as in the first preferred embodiment. Since the subsequent steps (parts (g) and (h) of FIG. 4) are the same as those in the first preferred embodiment, description thereof will not be provided repeatedly.

<Effects>

In the method of manufacturing the SOI wafer according to the present preferred embodiment, the step of forming the predetermined cavity pattern 3 on one of main surfaces of the support substrate 1 on which the insulating layer 2 is provided includes the step of exposing the cavity pattern 3 by using the first exposure mask, and the step of forming the plurality of superposition mark patterns 4 for specifying the position of the cavity pattern 3 in the outer peripheral portion on the one of the main surfaces of the support substrate 1 includes the step of exposing the superposition mark patterns 4 by using the second exposure mask. In other words, the exposure mask for the cavity pattern (the first exposure mask) and the exposure mask for the superposition mark patterns (the second exposure mask) are prepared as the exposure masks which are different from each other.

In addition to the effects described in the first preferred embodiment, accordingly, the reduced projection exposing device can be utilized. Therefore, a plurality of chips can be manufactured at one time. Consequently, a manufacturing efficiency can be enhanced. Moreover, the exposure mask for the reduced projection exposing device can be manufactured relatively inexpensively as compared with the exposure mask for the equimultiple projection exposing device, and the exposure mask for the superposition mark patterns can also be applied to different products in common Therefore, it is possible to obtain an effect of reducing the manufacturing cost. Furthermore, by using the reduced projection exposing device, a design rule for microprocessing can be applied and an application to a wafer having a large diameter of 8 inches or more can also be carried out.

Third Preferred Embodiment

Since a structure of an SOI wafer according to the present preferred embodiment is the same as that according to the second preferred embodiment, description thereof will not be provided repeatedly. In the present preferred embodiment, exposure masks for superposition mark patterns 4 and a cavity pattern 3 are positioned with reference to a prefabricated reference wafer. FIG. 5 includes a plan view and a sectional view showing the reference wafer. As shown in FIG. 5, the reference wafer is obtained by removing the active semiconductor layer 5 from the SOI wafer of FIG. 1. In other words, the superposition mark patterns 4 and the cavity pattern 3 which are the same as those in an SOI wafer as a product are formed on the reference wafer, and these patterns are exposed to a front surface.

FIG. 6 is a flow chart showing a method of manufacturing the SOI wafer according to the present preferred embodiment. At the final step of FIG. 6, an exposure is carried out to the manufactured SOI wafer. Although the reduced projection exposing device same as that in the second preferred embodiment is used also in the present preferred embodiment, it is not restricted but an ordinary exposing device is applicable. The exposing devices including the reduced projection exposing device will be hereinafter referred to simply as exposing devices.

First of all, the reference wafer is disposed on the wafer stage of the exposing device, and a detector of the exposing device detects the positions of the superposition mark patterns 4 and the cavity pattern 3 on the reference wafer. Information on the positions thus detected is stored in the exposing device and the reference wafer is then taken out of the exposing device.

Next, the support substrate 1 having the insulating layer 2 formed thereon is disposed on the wafer stage, and furthermore, an exposure mask for the superposition mark patterns 4, that is, the second exposure mask is provided on the mask stage to carry out an exposure subsequently to an application of a resist. In this case, exposing positions of the superposition mark patterns 4 are determined in accordance with the positional information which is prestored in the exposing device.

Next, the exposure mask for the cavity pattern 3, that is, the first exposure mask is disposed on the mask stage and an exposing position is determined to carry out an exposure with reference to the positional information on the reference wafer which is stored in the exposing device in the same manner as in the case of the exposure of the superposition mark patterns 4. Since the subsequent steps are the same as those in the second preferred embodiment, description thereof will not be provided repeatedly.

In a case in which more accurate positional information on each pattern formed on the reference wafer is available, the positional information is compared with the positional information on each pattern of the reference wafer which is detected by the exposing device, so that a slight shift of the individual exposing device is corrected to enable an execution of the exposing step, which is more preferable.

When the exposure is to be carried out on the SOI wafer, the superposition mark patterns 4 exposed to the front surface of the wafer are detected and reference is made to the positional information on the reference wafer which is stored in the exposing device to align the exposure mask with respect to the cavity pattern 3 which cannot be seen from the front surface. Also in the present step, the slight shift of the exposing device is corrected. Consequently, it is possible to further enhance precision in the alignment.

<Effects>

In the method of manufacturing the SOI wafer according to the present preferred embodiment, the step of exposing the cavity pattern 3 by using the first exposure mask and the step of exposing the superposition mark patterns 4 by using the second exposure mask are executed with reference to the same reference wafer.

In addition to the effects described in the second preferred embodiment, accordingly, it is possible to determine the exposing positions of the exposure mask for the superposition mark patterns 4 and the exposure mask for the cavity pattern 3 with higher precision by correcting the slight shift of the individual exposing device if accurate positional information on the patterns disposed on the reference wafer is available.

Fourth Preferred Embodiment

FIG. 7 is a partial sectional view illustrating a structure of a portion to be a feature of an SOI wafer according to the present preferred embodiment, inclusive of an outer peripheral portion. The present preferred embodiment is different from the first preferred embodiment (FIG. 1) in that an inner portion of each superposition mark pattern is filled with a silicon oxide film and a silicon oxide film is formed also in a cavity pattern. Other than the above, the same structure as that in FIG. 1 is employed and the position of the cavity pattern is specified by the superposition mark patterns in the same manner as in the first embodiment.

A method of manufacturing the SOI wafer according to the present preferred embodiment will be described with reference to parts (a) to (h) of FIG. 8. In the present preferred embodiment, the steps up to that of part (d) of FIG. 8, more specifically, the step of preparing a support substrate 1 (part (a) of FIG. 8), the step of forming an insulating layer 2 on the support substrate 1 (part (b) of FIG. 8), the step of exposing and developing superposition mark patterns 4 and a cavity pattern 3 (part (c) of FIG. 8), and the step of carrying out etching across a resist to form the superposition mark patterns 4 and the cavity pattern 3 (part (d) of FIG. 8), are the same as those in the first embodiment. After these steps, the insulating layer 2 is removed entirely by wet etching, for example (part (e) of FIG. 8). In the next step, a silicon oxide film serving as the insulating layer 2 is formed again on the support substrate 1 by a thermal oxidation method or a CVD method (part (f) of FIG. 8). At this time, the formation is carried out until deep trenches of the superposition mark patterns 4 are filled with the silicon oxide film. If there is no problem in respect of the characteristic of the SOI wafer, the deep trench of the cavity pattern 3 may be filled with the silicon oxide film. Since the subsequent steps (parts (g) and (h) of FIG. 8) are the same as those in the first embodiment, description thereof will not be provided repeatedly.

<Effects>

The insulating layer 2 provided in the SOI wafer according to the present preferred embodiment is characterized by being also formed in the cavity pattern 3 and the superposition mark patterns 4. In addition to the effects described in the first preferred embodiment, accordingly, the inner part of each of the superposition mark patterns 4 is filled with the insulating layer 2, that is, the silicon oxide film. Due to the entrance of the resist into the superposition mark patterns 4 or the generation of an etching residue in a step portion of each of the superposition mark patterns 4, it is possible to expect an effect of preventing the superposition mark patterns from serving as a source for generating a foreign substance.

The present invention allows free combination of the respective preferred embodiments or proper change or omission of the respective preferred embodiments without departing from the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. An SOI wafer comprising:
    a support substrate;
    an insulating layer formed on said support substrate, a predetermined cavity pattern being formed on one of main surfaces of said support substrate on which said insulating layer is provided;
    an active semiconductor layer formed on said insulating layer with said cavity pattern being closed, said active semiconductor layer not overlapping with said support substrate in plan view in an outer peripheral portion of said support substrate; and
    a plurality of superposition mark patterns formed in said outer peripheral portion on said one of the main surfaces of said support substrate for specifying a position of said cavity pattern.

2. The SOI wafer according to claim 1, wherein said cavity pattern and said superposition mark patterns are formed to have depths reaching said support substrate in penetration through said insulating layer.

3. The SOI wafer according to claim 1, wherein said insulating layer is also formed in said cavity pattern and said superposition mark patterns.

4. The SOI wafer according to claim 1, wherein said superposition mark patterns are exposed.

5. A method of manufacturing an SOI wafer, the method comprising the steps of:
    (a) preparing a support substrate;
    (b) forming an insulating layer on said support substrate;
    (c) forming a predetermined cavity pattern on one of main surfaces of said support substrate on which said insulating layer is provided;
    (d) forming an active semiconductor layer on said insulating layer with said cavity pattern being closed, said active semiconductor layer not overlapping with said support substrate in plan view in an outer peripheral portion of said support substrate; and
    (e) forming a plurality of superposition mark patterns for specifying a position of said cavity pattern in said outer peripheral portion on said one of the main surfaces of said support substrate.

6. The method of manufacturing an SOI wafer according to claim 5, wherein said step (c) and said step (e) are carried out at one time by using a single exposure mask.

7. The method of manufacturing an SOI wafer according to claim 5, wherein
    said step (c) includes the step of exposing said cavity pattern by using a first exposure mask, and
    said step (e) includes the step of exposing said superposition mark patterns by using a second exposure mask.

8. The method of manufacturing an SOI wafer according to claim 5, wherein
    said step (c) includes the step of exposing said cavity pattern by using a first exposure mask,
    said step (e) includes the step of exposing said superposition mark patterns by using a second exposure mask, and
    said step (c) and said step (e) are executed with reference to a single reference wafer.

\* \* \* \* \*